United States Patent
Prakash et al.

(10) Patent No.: US 9,042,188 B2
(45) Date of Patent: May 26, 2015

(54) MEMORY CONTROLLER AND METHOD OF CALIBRATING A MEMORY CONTROLLER

(71) Applicant: ARM LIMITED, Cambridge (GB)

(72) Inventors: Gyan Prakash, Bangalore (IN); Nidhir Kumar, Bangalore (IN)

(73) Assignee: ARM Limited, Cambridge (GB)

( * ) Notice: Subject to any disclaimer, the term of this patent is extended or adjusted under 35 U.S.C. 154(b) by 83 days.

(21) Appl. No.: 13/854,226

(22) Filed: Apr. 1, 2013

(65) Prior Publication Data

US 2014/0293718 A1    Oct. 2, 2014

(51) Int. Cl.
*G11C 7/22* (2006.01)
*G06F 3/041* (2006.01)

(52) U.S. Cl.
CPC ...... *G06F 3/0418* (2013.01); *G11C 2207/2254* (2013.01)

(58) Field of Classification Search
USPC ............ 365/233.11, 233.13, 233.1, 193, 194, 365/191, 233.19
See application file for complete search history.

(56) References Cited

U.S. PATENT DOCUMENTS

| | | | |
|---|---|---|---|
| 7,036,053 B2 | 4/2006 | Zumkehr et al. | |
| 7,111,111 B2 | 9/2006 | Neuman et al. | |
| 7,165,185 B2 | 1/2007 | Li et al. | |
| 7,499,368 B2 * | 3/2009 | Rao et al. | 365/233.1 |
| 7,886,174 B2 | 2/2011 | Spry et al. | |
| 8,037,375 B2 | 10/2011 | Schaefer | |
| 8,121,237 B2 | 2/2012 | Stott et al. | |
| 8,295,118 B2 | 10/2012 | Best et al. | |
| 2006/0203602 A1 | 9/2006 | Best et al. | |
| 2007/0002642 A1 | 1/2007 | Butt et al. | |
| 2008/0276133 A1 | 11/2008 | Hadley et al. | |
| 2009/0021998 A1 | 1/2009 | Millar et al. | |
| 2010/0246290 A1 | 9/2010 | MacLaren et al. | |
| 2011/0040902 A1 | 2/2011 | Housty | |
| 2011/0078370 A1 | 3/2011 | Chaudhuri et al. | |
| 2011/0128793 A1 | 6/2011 | Venkataraman et al. | |
| 2011/0158020 A1 * | 6/2011 | Hwang | 365/203 |

OTHER PUBLICATIONS

U.S. Appl. No. 13/726,392, filed Dec. 24, 2012, Kumar et al.
U.S. Appl. No. 13/726,395, filed Dec. 24, 2012, Kumar et al.
U.S. Appl. No. 13/726,383, filed Dec. 24, 2012, Prakash et al.
U.S. Appl. No. 13/861,641, filed Apr. 12, 2013, Prakash et al.
"JESD79-3F (Revision of JESD79-3E, Jul. 2010)", DDR3 SDRAM Standard, (Jul. 2012), 226 pages.
P. Fleming et al, "Algorithm for Adjustment of DDR Write Interface Timing" ISSC 2008, Jun. 2008, pp. 144-148.

(Continued)

*Primary Examiner* — Andrew Q Tran
(74) *Attorney, Agent, or Firm* — Nixon & Vanderhye P.C.

(57) ABSTRACT

A memory controller transmits a data signal, a data strobe signal and a mask signal to a memory, wherein each transition of the data strobe signal indicates a sample point for the data signal and the mask signal indicates a validity of the data signal. A mask signal training procedure is carried out comprising three steps. Writing first and second values to the memory for a predetermined plurality of transitions of the data strobe signal with the mask signal set to indicate that the first data signal is valid and the second data signal is valid except for a selected transition of the predetermined plurality. Reading from the memory for the predetermined plurality of transitions of the data strobe signal. Determining a timing offset for the mask signal for which the value read at the selected transition matches the first value.

19 Claims, 15 Drawing Sheets

(56) References Cited

OTHER PUBLICATIONS

Notice of Allowance mailed Mar. 11, 2014 in co-pending U.S. Appl. No. 13/726,392.

Notice of Allowance mailed Oct. 8, 2014 in co-pending U.S. Appl. No. 13/726,395.

Office Action mailed Jan. 29, 2015 in co-pending U.S. Appl. No. 13/861,641, 13 pages.

* cited by examiner

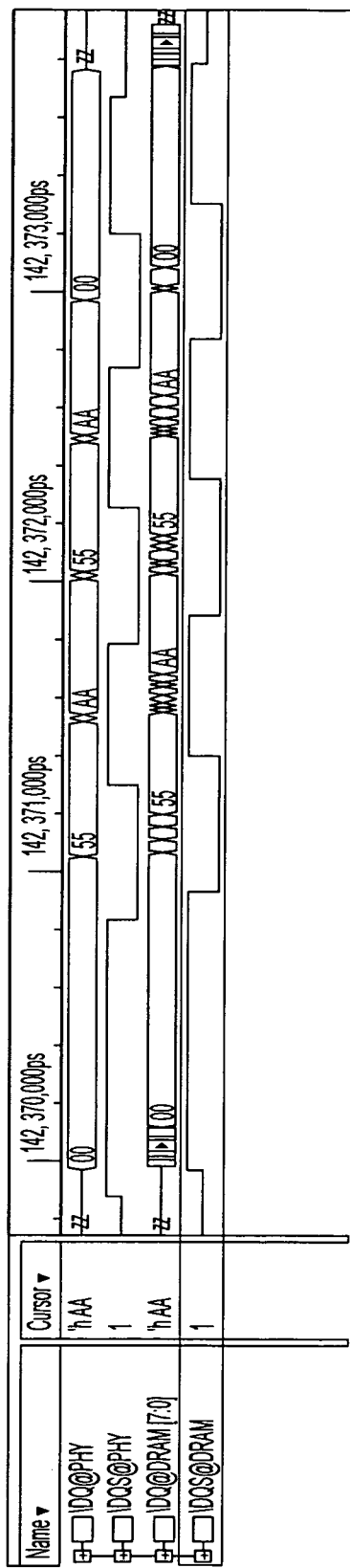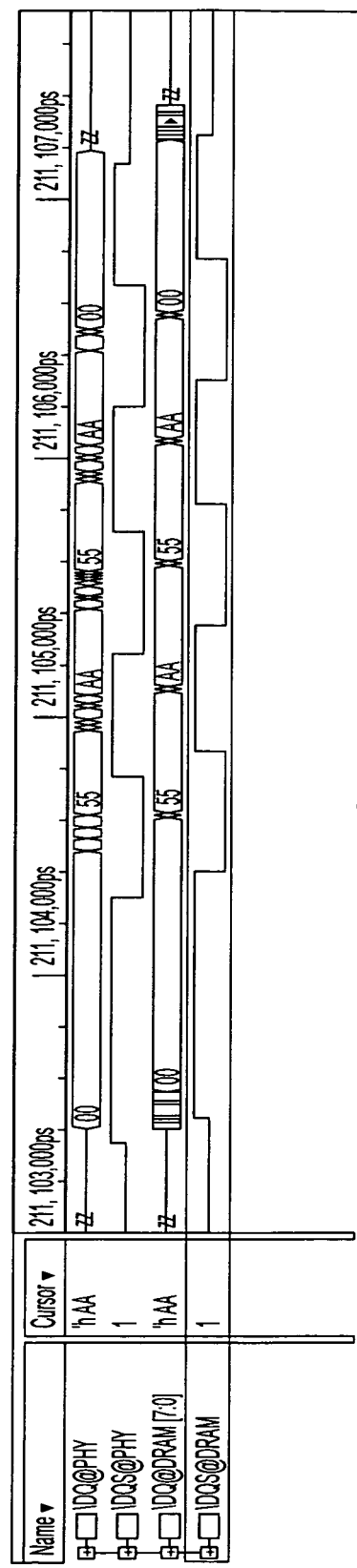
FIG. 9A
FIG. 9B

MEMORY CONTROLLER AND METHOD OF CALIBRATING A MEMORY CONTROLLER

This application incorporates by reference the subject matter disclosed in each of the following US patent applications: "A data signal receiver and method of calibrating a data signal receiver"—U.S. patent application Ser. No. 13/726,395; "A method and apparatus for aligning a clock signal and a data strobe signal in a memory system"—U.S. patent application Ser. No. 13/726,392; and "An interface for controlling the phase alignment of clock signals for a recipient device"—U.S. patent application Ser. No. 13/726,383.

BACKGROUND OF THE INVENTION

1. Field of the Invention

The present invention relates to a memory controller. More particularly, this invention relates to the calibration of a memory controller which is configured to transmit a data signal, a data strobe signal and a mask signal to a memory.

2. Background

It is known to provide a memory controller configured to transmit a data signal, a data strobe signal and a mask signal to a memory, wherein each transition of the data strobe signal indicates a sample point for the data signal and the mask signal indicates a validity of the data signal. A typical contemporary example of such a memory controller is as part of a dual data rate (DDR) dynamic-random access memory (DRAM) system, in which write data (DQ) transmitted from the memory controller to the DRAM modules and a write data mask (DM) are captured on both the rising and the falling edge of the data strobe signal (DQS). The memory controller makes use of the mask signal (DM) to indicate at any given sample point for the data signal whether that data signal should be interpreted as valid data or not.

According to the state of the art, the corresponding JEDEC specification standard (JESD79-3E) requires the write data eye to present at the centre of DQS to balance the requirements of set-up/hold times and noise tolerance. However, as differential data rates increase, for example at the DDR data rates above 1600 Mb/s DDR3 system, the write data eye training process becomes particularly difficult, because of the presence of system jitter, PCB trace skew and DRAM uncertainty which render known automated self calibration systems unreliable. In high frequency regimes (for example operating at data rates of 2133 Mb/s, where the ideal data eye has an opening of only 468 ps), typical system jitter, PCB trace skew and DRAM uncertainty are such that the above mentioned technique of simply seeking the set DQS in the centre of the DQ bus is not reliable.

Background information related to known DDR write data eye training procedures can be found in: the publication "Algorithm for Adjustment of DDR Write Interface Timing", Patrick Fleming/Pawel Ostropolski (Intel), ISSC, 2008 available at http://ieeexplore.ieee.org/stamp/stamp.jsp?arnumber=4780944, as well as in the following patent publications:

1. "Software-Controlled Dynamic DDR Calibration", Andrew Hadley et al, US20080276133;
2. "Scheme for optimal settings for DDR interface", Darren Neuman et al, U.S. Pat. No. 7,111,111;
3. "Two dimensional data eye centering for source synchronous data transfers", John F. Zumkehr et al, U.S. Pat. No. 7,036,053;
4. "Fast data eye retraining for a memory", Andre Schaefer, U.S. Pat. No. 8,037,375;
5. "Memory link training", Bryan L. Spry et al, U.S. Pat. No. 7,886,174; and
6. "DDR II write data capture calibration", Wen Li et al, U.S. Pat. No. 7,165,185.

It would be desirable to provide an improved technique for calibrating a memory controller for data transmission for operation at high data rates to achieve an improved write eye opening in the presence of typical system jitter, PCB trace skew and DRAM uncertainty.

SUMMARY

Viewed from a first aspect, the present invention provides a method of calibrating a memory controller, said memory controller configured to transmit a data signal, a data strobe signal and a mask signal to a memory, wherein each transition of said data strobe signal indicates a sample point for said data signal and said mask signal indicates a validity of said data signal, the method comprising performing a mask signal training procedure comprising the steps of:

a) writing a first value to said memory for a predetermined plurality of transitions of said data strobe signal with said mask signal set to indicate that said data signal is valid;

b) writing a second data value to said memory for said predetermined plurality of transitions of said data strobe signal with said mask signal set to indicate that said data signal is valid except for a selected transition of said predetermined plurality of transitions for which said mask signal is set to indicate that said data signal is invalid, wherein said second value is an inverse of said first value;

c) reading from said memory for said predetermined plurality of transitions of said data strobe signal and determining if a value read at said selected transition matches said first value; and d) determining a timing offset for said mask signal for which said value read at said selected transition matches said first value.

The present invention recognises that at the high data rates of contemporary memory systems, an improved write data eye training procedure can be achieved by not only calibrating the respective timing of the data signal and the data strobe signal, but also calibrating the respective timing of the mask signal and the data strobe signal. The mask signal training procedure provided achieves this by writing a first data value to the memory for a predetermined plurality of transitions of the data strobe signal for which the mask signal is set to indicate that the data signal is valid. This is followed by a second step in which a second data value is written to the memory for the same predetermined plurality transitions of the data strobe signal wherein the mask signal is set to indicate that the data signal is valid for all but one of the predetermined plurality transitions. Accordingly, the second data value will overwrite the first data value in the memory for all transitions of that predetermined plurality of transitions except for the one selected transition where the mask signal indicates that the data signal is invalid. The second data value is an inverse of the first data value and accordingly, after the second write operation, the relevant storage location of the memory should (if the write operations have been successfully carried out) hold a sequence of second data values interrupted by a single instance of the first data value (corresponding to the selected transition). Hence, in a third step the memory controller reads from the memory for the predetermined plurality of transitions of the data strobe signal and determines if a value read at that selected transition matches the first value. For this to be the case however the relative timing of the mask signal and the data strobe signal must be correctly calibrated and the final step of the procedure comprises determining a timing offset of the mask signal for which the value read at that selected transition matches the first value. This determination could be carried out in a number of different ways, for example by repeating the mask signal training procedure whilst incrementing the timing offset for the mask signal to allow a determination of a value of the timing offset which results in a value read at the selected transition matching the first value.

In some embodiments said selected transition is preceded and followed by at least one transition in said predetermined plurality of transitions. Because the timing offset for the mask signal is to be determined by the procedure, it cannot be relied upon that a transition at the beginning or the end of the predetermined plurality of transitions will allow correct writing of the data signal to the memory. Indeed, the extent to which the beginning and end of the predetermined plurality of transitions maybe unreliable in this manner depends upon the possible variation in the timing offset of the mask signal and in one embodiment the selected transition is proceeded and followed by at least two transitions in the predetermined plurality of transitions.

In some embodiments, determining if said value read at said selected transition matches said first value further comprises determining if a value read at a transition preceding said selected transition and a value read at a transition following said selected transition each match said second value. Where only the value read at the selected transition should correspond to the first value, the remainder of the values read in the predetermined plurality of transitions of the data strobe signal should correspond to the second value and accordingly by further requiring that a value read at a transition preceding the selected transition and the value read at a transition following the selected transition each match the second value a more reliable identification of the selected transition can be achieved with less sensitivity to false positives.

In some embodiments performing said mask signal training procedure further comprises repeating said steps of a) writing said first value to said memory, b) writing said second data value to said memory and c) reading from said memory iteratively to determine a valid range of said timing offset for said mask signal. For example, by sweeping the timing offset through its possible range of values, and at each iterative step of that sweep performing the steps of a) writing said first value to said memory, b) writing said second value said memory and c) reading from said memory, a valid range of said of the timing offset for the mask signal can be determined as corresponding to those timing offsets which result in the value read at the selected transition matching the first value.

The determination of a valid range of the timing offset for the mask signal allows a subsequent choice to be made of a selected timing offset for the mask signal within that valid range. For example, in some embodiments a calibrated mask signal timing offset is selected from said valid range of said timing offset for said mask signal such that said data strobe signal is aligned centrally with respect to said valid range of said timing offset for said mask signal. The valid range of the timing offset for the mask signal corresponds to a data mask signal "eye" within which the transitions of the data strobe signal must be placed for the mask signal to correctly indicate the validity of the corresponding data signal. Whilst some variation within this eye is possible, it is advantageous if the data strobe signal is aligned centrally therein, in order to give a balanced set up and hold timing margin for the mask signal.

In some embodiments said mask signal training procedure is repeated to determine an averaged timing offset for said mask signal.

In some embodiments the method further comprises performing a data signal training procedure, said data signal training procedure comprising the steps of:

a) writing a predetermined sequence of data values to said memory over a second predetermined plurality of transitions of said data strobe signal;

b) reading data values from said memory over said second predetermined plurality of transitions of said data strobe signal and determining if a selected subset of said data values read from said memory matches a corresponding subset of said predetermined sequence of data values written to said memory; and c) determining a timing offset for said data signal for which said selected subset of said data values read from said memory matches said corresponding subset of said predetermined sequence of data values written to said memory.

The method may further comprise a data signal training procedure, which may for example be carried out subsequent to the mask signal training procedure, in which a predetermined sequence of data values is written to the memory and then read back from the memory. When the data values are read back from the memory it is determined if a selected subset of the data value (i.e. fewer data values than in the full sequence written to and read from the memory) matches a corresponding subset of the predetermined sequence of data values written to the memory. Correct writing of data values to the memory is dependent on the relative timing of the data signal, and the final step of the data signal training procedure is to determine a timing offset for the data signal for which the selected subset of data values read from the memory matches the corresponding subset of data values written to the memory. Accordingly, by identifying that a particular sequence of data values written to the memory has then also been read back from the memory, a valid timing offset for the data signal can be determined.

More than one timing offset for the data signal may be determined and in some embodiments performing said data signal training procedure further comprises repeating said steps of a) writing a predetermined sequence of data values to said memory and b) reading said data values from said memory iteratively to determine a valid range of said timing offset for said data signal. Thus by performing an iterative procedure in which the writing and reading steps are repeated at each iteration a number of timing offsets can be determined, forming a valid range of the timing offset for the data signal.

In some embodiments, said corresponding subset of said predetermined sequence of data values represents a unique pattern in said predetermined sequence of data values. Arranging the subset to be a unique pattern in the sequence facilitates correct identification of that subset.

In some embodiments said selected subset of data values is preceded and followed by at least one data value in said predetermined sequence of data values. For example, in one embodiment the selected subset of data values is preceded and followed by two data values in the predetermined sequence, where the predetermined sequence comprises eight data values. This "padding" accounts for the high impendence state on DQ before and after the write and thus ensures that the selected subset can be written and read reliably.

The data signal training procedure may be repeated to determine an averaged timing offset for the data signal.

In some embodiments the data signal is a multi-bit data signal, and in some such embodiments the timing offset for the data signal is determined for each bit of the multi-bit data signal.

When a valid range of the timing offset for the data signal has been determined, a calibrated data signal timing offset is selected from said valid range of said timing offset for said data signal such that said data strobe signal is aligned centrally with respect to said valid range of said timing offset for said data signal. Selecting the timing offset for the data signal to place the data strobe signal centrally within the valid range provides a balanced setup and hold timing margin with respect to the data signal.

In embodiments in which the timing offset for the data signal is determined for each bit of a multi-bit data signal, a calibrated data signal timing offset may be determined for each bit of the multi-bit data signal such that the mid point of said valid range of said timing offset for each bit of said data signal are aligned with one another. Accordingly, the "data eye" for the multi-bit data signal may be produced by aligning the centre of each individual data bit eye, rather than for example aligning the relative eye opening of each bit. This improves the overall set up and hold timing margins.

It may be the case that only a finite timing offset for each bit of a multi-bit data signal can be implemented and in some embodiments if said calibrated data signal timing offset for any bit of said multi-bit data signal is determined to exceed a predetermined limit, said method further comprises generating information indicative of an extent to which said predetermined limit has been exceeded. Hence the user may be provided with diagnostic and debugging information if it is found that a timing offset for at least one bit of the multi-bit data signal is larger than that which can be provided by the system.

Viewed from a second aspect the present invention provides a memory controller, said controller configured to transmit a data signal, a data strobe signal and a mask signal to a memory, wherein each transition of said data strobe signal indicates a sample point for said data signal and said mask signal indicates a validity of said data signal, the memory controller configured to:

a) write a first value to said memory for a predetermined plurality of transitions of said data strobe signal with said mask signal set to indicate that said data signal is valid;

b) write a second data value to said memory for said predetermined plurality of transitions of said data strobe signal with said mask signal set to indicate that said data signal is valid except for a selected transition of said predetermined plurality of transitions for which said mask signal is set to indicate that said data signal is invalid, wherein said second value is an inverse of said first value;

c) read from said memory for said predetermined plurality of transitions of said data strobe signal and determining if a value read at said selected transition matches said first value; and d) determine a timing offset for said mask signal for which said value read at said selected transition matches said first value.

In some embodiments said memory controller comprises a delay unit configured to apply a transmission timing offset for said data signal when said data signal is transmitted to said memory, and wherein said memory controller is configured to use said delay unit to apply a reception timing offset for a received data signal when said received data signal is received from said memory. Accordingly, using the same delay line for both read and write timing offsets, both power and area in the integrated circuit maybe saved, for example using a dual port DLL as the delay unit. A multiplexer may be introduced between two input ports and the delay line to achieve this.

Viewed from a third aspect the present invention provides a memory controller, said memory controller configured to transmit a data signal, a data strobe signal and a mask signal to a memory, wherein each transition of said data strobe signal indicates a sample point for said data signal and said mask signal indicates a validity of said data signal, the memory controller comprising:

a) means for writing a first value to said memory for a predetermined plurality of transitions of said data strobe signal with said mask signal set to indicate that said data signal is valid;

b) means for writing a second data value to said memory for said predetermined plurality of transitions of said data strobe signal with said mask signal set to indicate that said data signal is valid except for a selected transition of said predetermined plurality of transitions for which said mask signal is set to indicate that said data signal is invalid, wherein said second value is an inverse of said first value;

c) means for reading from said memory for said predetermined plurality of transitions of said data strobe signal and determining if a value read at said selected transition matches said first value; and d) means for determining a timing offset for said mask signal for which said value read at said selected transition matches said first value.

BRIEF DESCRIPTION OF THE DRAWINGS

The present invention will be described further, by way of example only, with reference to embodiments thereof as illustrated in the accompanying drawings, in which:

FIG. 9A shows a simulation of the relationship between a data signal and a data strobe signal in one embodiment before calibration is carried out; and FIG. 9B shows a simulation of the relationship between a data signal and a data strobe signal in one embodiment after calibration has been carried out.

DESCRIPTION OF THE PREFERRED EMBODIMENTS

Figure 1:
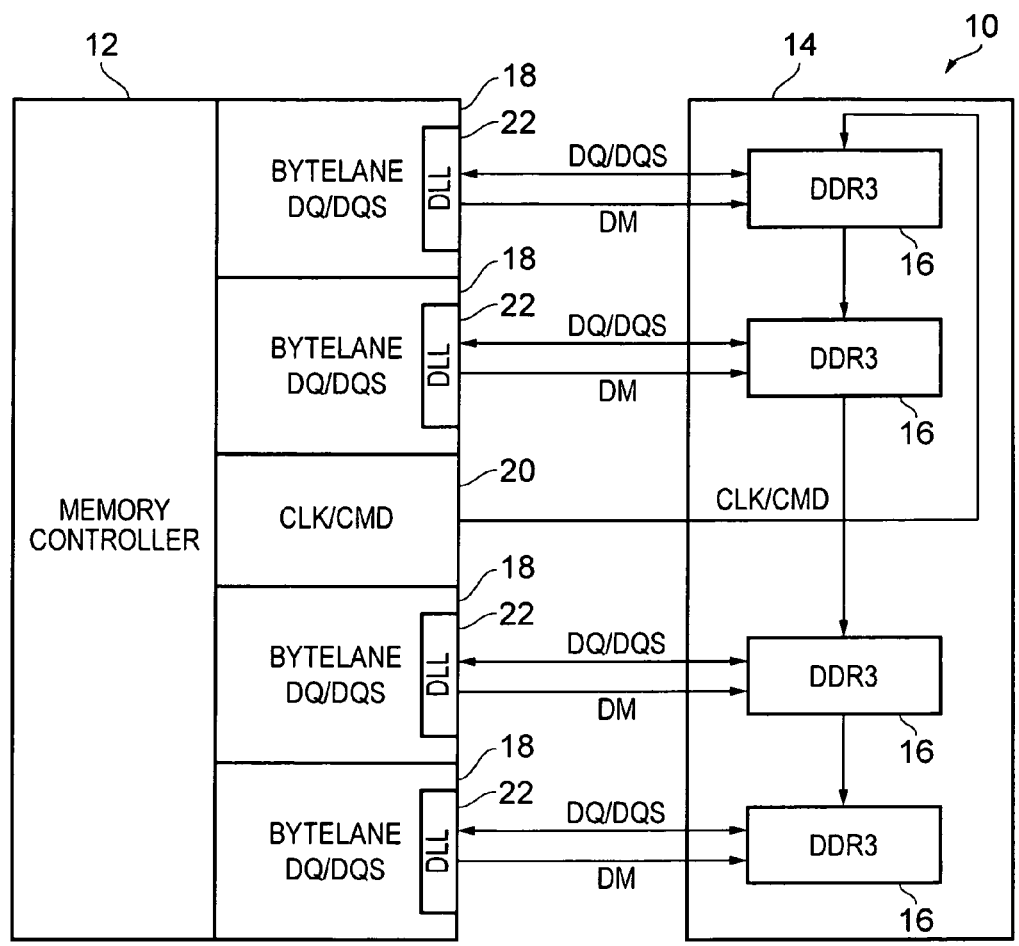
FIG. 1 schematically illustrates a dual data rate DRAM system in which a memory controller controls access to four DDR3 modules in one embodiment.

FIG. 1 schematically illustrates a DDR memory system 10, which generally comprises a memory controller integrated circuit 12 and a memory module integrated circuit 14. The memory module integrated circuit 14 comprises four DDR3 modules 16, each of which may be accessed in parallel by its own dedicated bytelane 18 provided as part of the memory controller integrated circuit 12. The memory controller integrated circuit 12 further comprises a clock/command (CLK/CMD) module 20 which is configured to transmit clock and command signals to the DDR3 modules 16. In the illustrated embodiment shown in FIG. 1, the CLK/CMD signals are transmitted between the DDR3 modules in a "fly-by" configuration to improve signal integrity (avoiding the reflections associated with a branching topology). Accordingly, the memory controller 12 can cause data to be read from one of the DDR3 modules 16 by issuing appropriate command (CMD) signals via the CLK/CMD path (in association with the clock signal CLK which is also transmitted via that route), the requested data being returned from the corresponding DDR3 module via its associated DQ/DQS path to the corresponding bytelane 18 of the memory controller 12. Equally, the memory controller 12 can cause data to be written to one of the DDR3 modules 16 by issuing appropriate command (CMD) signals via the CLK/CMD path, the write data being transmitted from the respective bytelane 18 of the memory controller 12 to the corresponding DDR3 module via its associated DQ/DQS path. When writing data to one of the DDR3 modules, in addition to the data signal (DQ) and data strobe signal (DQS) transmitted from the memory controller to the DRAM module(s), each bytelane is configured also to transmit a mask signal (DM) which indicates the validity of the data signal. Accordingly, only data signals received by the memory in association with mask signal indicating "valid" will be written to the memory.

In a write configuration, in order for the DDR3 modules 16 to be able to correctly interpret the data transmitted as the DQ signal, it is necessary for the relative timing of the DQS signal to be correctly calibrated, since the data strobe signal DQS indicates the sample points at which the DQ signal should be sampled. Each bytelane further comprises a set of delay-locked loop (DLL) logic 22 enabling these relative timings to be adjusted under the overall control of the memory controller 12. Further detail of this logic 22 is set out below with reference to FIG. 4.

Figure 2:
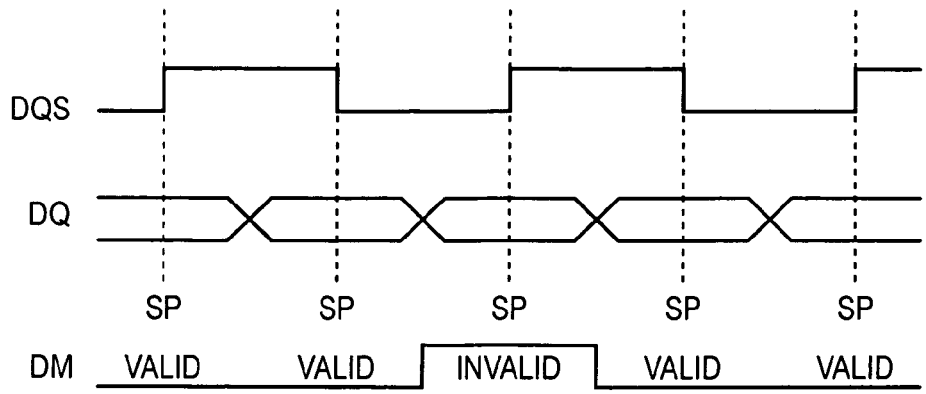
FIG. 2 schematically illustrates the relative timing of a data strobe signal, a data signal and a mask signal in one embodiment.

FIG. 2 schematically illustrates the data strobe signal (DQS), the data signal (DQ) and the mask signal (DM) in a theoretical (ideal signal forms and relative timings) configuration resulting from a perfect calibration procedure. As can be seen in the figure, each transition point (both rising and falling edge) of DQS indicates a sample point (SP) for the DQ signal. Ideally, these points fall centrally in the eye of the DQ signal, to give the best balance of set-up and hold times. Additionally, in this write configuration, a mask signal (DM) is also transmitted in association with the data signal, indicating its validity. As shown in the figure, the first and last two data values in the DQ signal are indicated to be valid, whilst the middle data value is marked as invalid. This third data value will therefore not be written to the memory.

Figure 3:
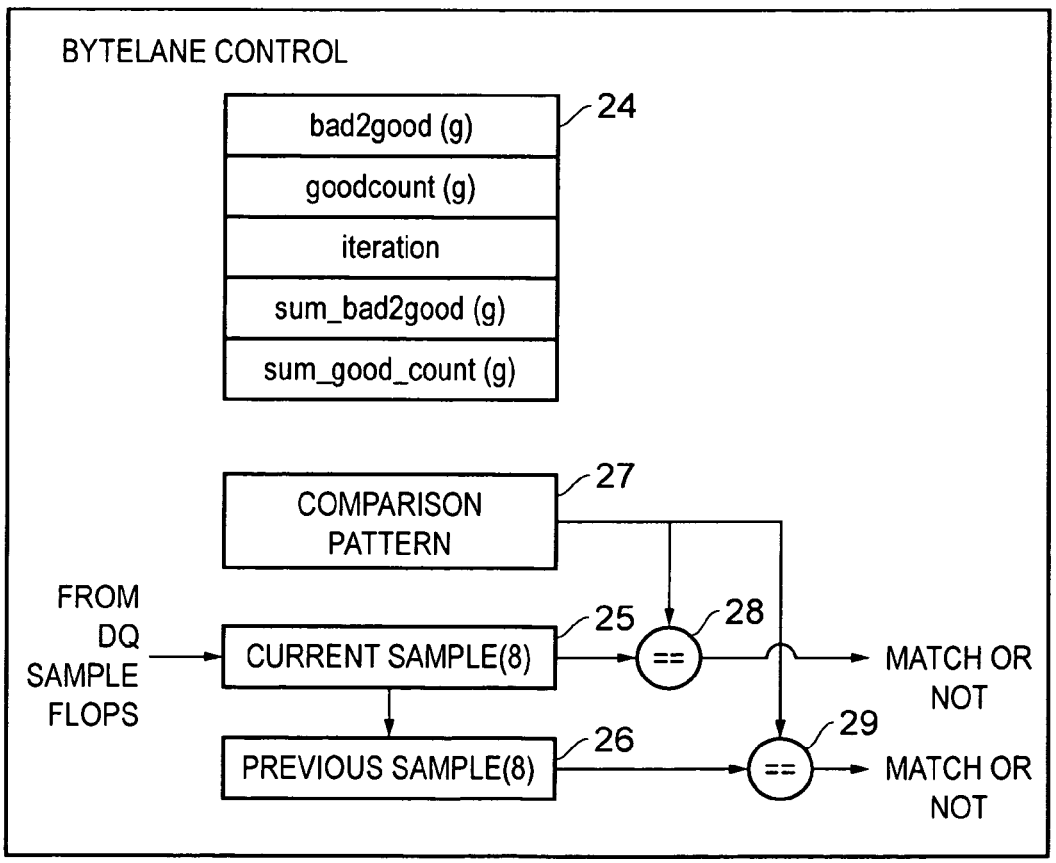
FIG. 3 schematically illustrates example registers and comparators which are provided in a bytelane controller in one embodiment.

FIG. 3 schematically illustrates some registers and comparators which may be provided within a bytelane controller associated with each bytelane 18 in one embodiment. Four 9-entry registers (bad2good, good_count, sum_bad2good and sum_good_count) and one single entry register (iteration) 24 are provided for tracking various quantities in the calibration process. Eight of the entries correspond to the eight DQ bits in each bytelane and one further entry corresponds to the DM bit in each bytelane, as will be discussed in more detail in the following. Also a "current sample" register 25 and "previous sample" register 26 (each being 8-entry) are provided to allow comparison with a pre-stored comparison pattern 27, by means of comparators 28 and 29. The "current sample" and "previous sample" registers are configured such that the content of the "current sample" register is transferred to the "previous sample" after each iteration. Further detail of this comparison process is given in the following description.

Figure 4:
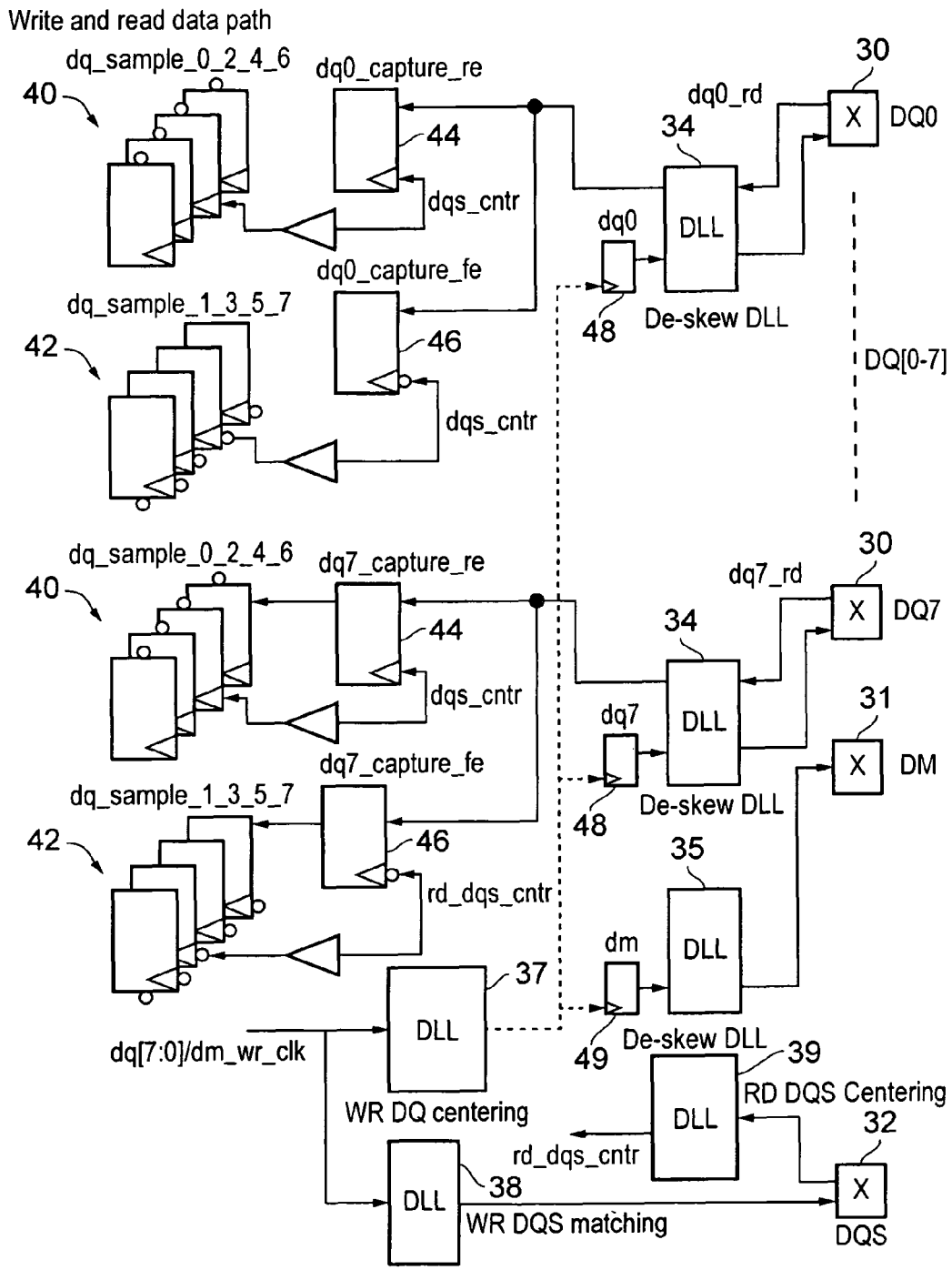
FIG. 4 schematically illustrates delay-locked loop (DLL) logic and sampling flops of each bytelane shown in FIG. 1.

The delay-locked loop (DLL) logic 22 provided in each bytelane 18 is schematically illustrated in FIG. 4. On the right hand side of the figure are shown the PHY inputs/outputs 30 for DQ0 and DQ7, the PHY output for DM and the PHY input/output for the DQS signal 32. Further DQ PHY inputs/outputs for DQ1-DQ6 are omitted from the figure for clarity of illustration only. Specifically, the DLL 22 (see FIG. 1) in each bytelane comprises a de-skew DLL 34 provided for each bit of the corresponding DQ signal and a de-skew DLL 35 for the DM signal. Power and area in the integrated circuit are saved by providing the each DQ bit de-skew DLL as a dual port DLL, so that the same delay line is shared for both write and read de-skew. Each de-skew DLL 34 comprises a multiplexer (not shown) to achieve this. These multiplexers could equally be provided as separate components between each de-skew DLL 34 and PHY input/output 30. The DLL 22 in each bytelane also comprises a DQ centering DLL 37 and DQS matching DLL 38 (used in write mode) and a DQS centering DLL 39 (used in read mode). The DQ centering DLL 37 provides an overall timing offset for the DQ signal bits and the DM signal, whilst the DQS matching DLL 38 and the DQS centering DLL 39 provide timing offsets for the DQS signal.

Also illustrated in FIG. 4 are the sets of flops 40, 42, 44, 46 associated with each DQ bit, which the bytelane DQ/DQS modules 18 use as part of the calibration procedure for the various DLL units mentioned above. These flops comprise, for each DQ bit, a rising edge capturing flop 44 and a falling edge capturing flop 46. Further, sampling flops 40 are configured to hold samples from a sequence of rising edges (labelled 0, 2, 4, 6), whilst sampling flops 42 are configured to hold samples from a sequence of falling edges (labelled 1, 3, 5, 7). As will be described in more detail in the following, these sampling flops are used to capture samples of a fixed pattern of data which is returned from the DRAM modules during the write eye calibration procedure. FIG. 4 also shows flops 48, 49 which hold the respective data values to be transmitted as the write data signal DQ and the mask signal DM during a write operation.

Figure 5A:
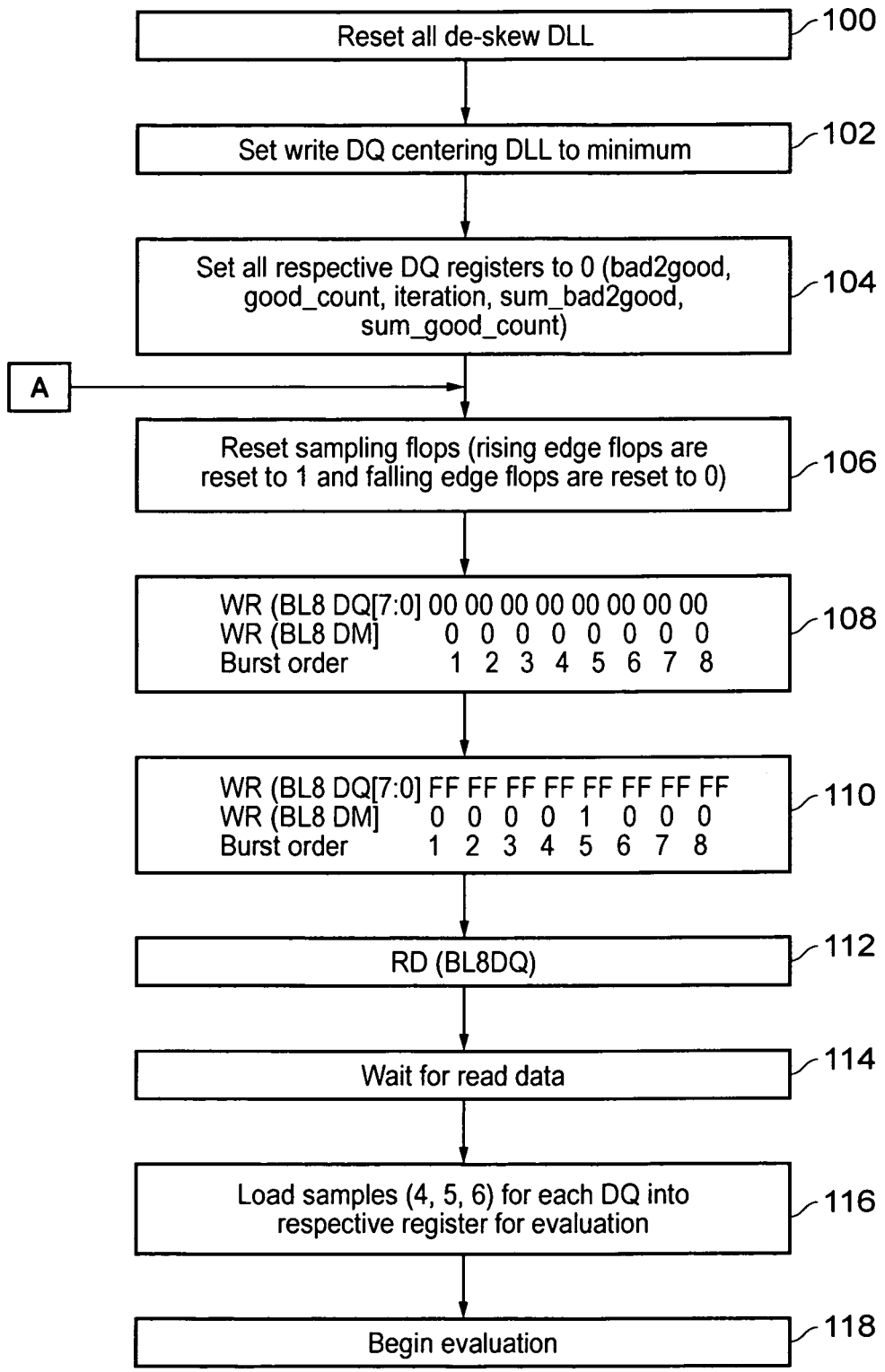
FIG. 5A schematically illustrates a series of steps taken in one embodiment in which a mask signal training procedure is carried out.
Figure 5B:
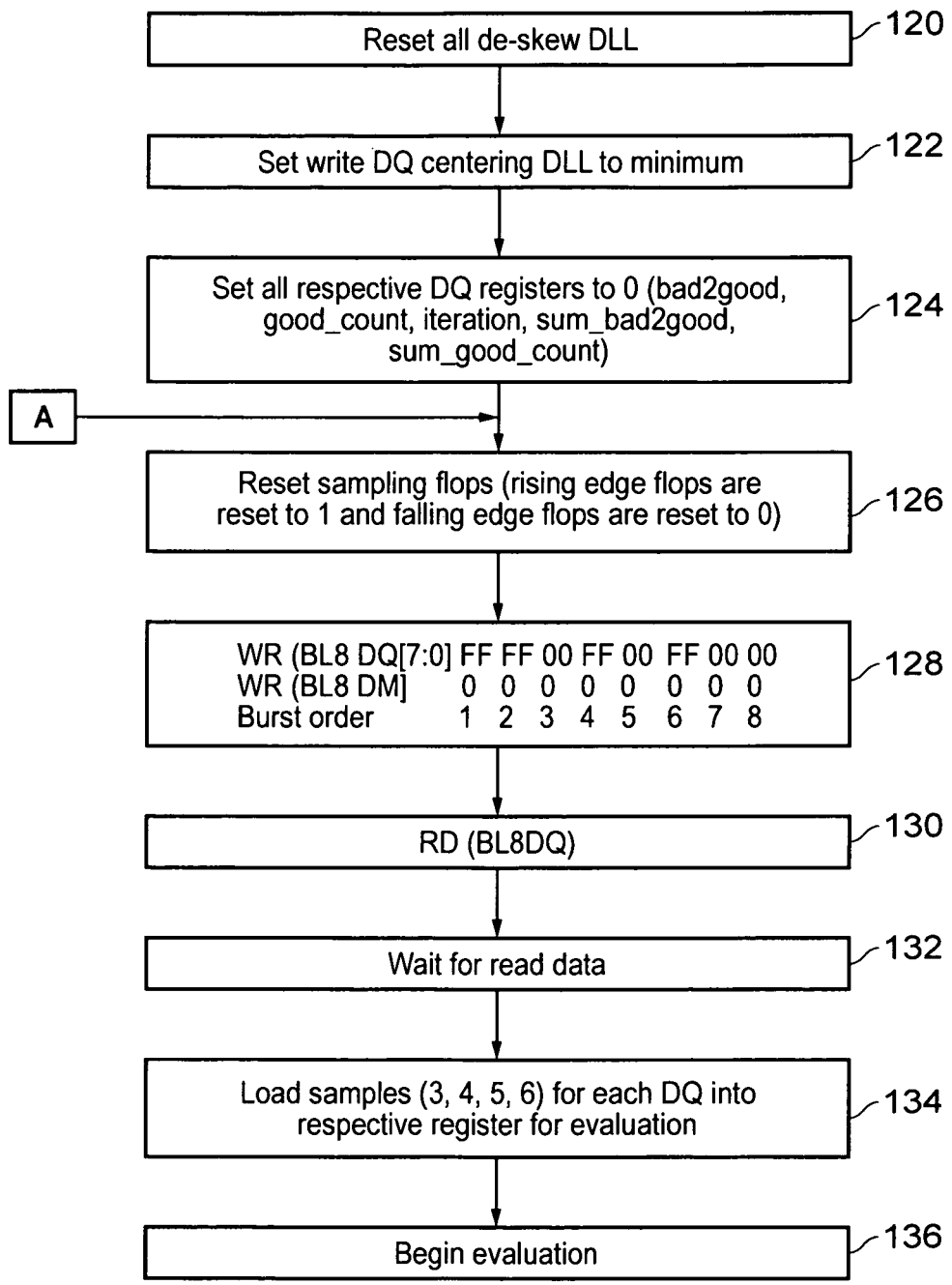
FIG. 5B schematically illustrates a series of steps in one embodiment in which a data signal training procedure is carried out.

FIGS. 5A/B and FIGS. 6A-6G illustrate a sequence of steps which are taken in one embodiment when carrying out a write data eye training procedure by which the DLL logic 22 of each bytelane 18 of the memory controller 12 is calibrated. Firstly it should be noted that FIGS. 5A and 5B show alternative initial steps which lead into the evaluation procedure that begins in FIG. 6A. FIG. 5A begins a sequence of steps ("DM training") by which the timings for the DM signal are determined and FIG. 5B begins a sequence of steps ("DQ training") by which the timings for the DQ signal are determined.

The full write calibration procedure begins with the steps shown in FIG. 5A for the DM training. Firstly (at step 100) all de-skew DLL logic 34 and 35 are reset. For example, these can be set to a minimum possible value (setting the DQ bits/DM timing in advance by 90 degrees of their default central position) with respect to the overall offset provided by the write centering DLL 37. At step 102 the write centering DLL 37 in each bytelane is also set to an initiation value of zero. At step 104 the various DQ registers used during the following calibration procedure are all set to 0 (bad2good, good_count, iteration, sum_bad2good and sum_good_count).

The iterative steps of the process are then started at step 106 where all sampling flops 40, 42, 44, 46 are reset, the rising edge flops being reset to 1 and the falling edge flops being reset to 0. Then at step 108 the memory controller 12 (via each bytelane 18) instructs the DRAM modules 16 to perform a write operation in BL8 mode (burst length 8) in which a sequence of eight 0s over 8 beats is written on each DQ bit (this is indicated in short-hand in the figure as 00 00 00 00 00 00 00 00). At this step DM is held at 0 (i.e. a write operation in BL8 mode writes a sequence of eight 0s over 8 beats on the DM bit), indicating that the DQ signal is valid throughout. After this first write operation, a second write operation is carried out at step 110, also in BL8 mode in which a sequence of eight 1s over 8 beats are transmitted on each DQ bit (this is indicated in short-hand in the figure as FF FF FF FF FF FF FF FF). Accompanying this, the DM signal is held at 0 (valid) for the first 4 beats of the sequence, switching to 1 (invalid) for beat 5, and returning to 0 (valid) for the last three beats of the sequence (this is indicated in short-hand in the figure as 0000F000). Then at step 112, the memory controller 12 (via each bytelane 18) instructs the DRAM modules 16 to perform a read operation in BL8 mode on each DQ bit. Hence, if the relative timing of DQ, DM and DQS is correct at this iteration of the process, the sequence 11110111 should be received on each DQ bit. At step 114 each bytelane waits for the read data to return. When the read data has been captured by the respective bytelane, for the purposes of the DM training procedure at step 116 the $4^{th}$, $5^{th}$ and $6^{th}$ samples (i.e. numbered 4, 5, 6) for each DQ bit are loaded into a respective register for evaluation and that evaluation begins at step 118. Note that these particular samples are examined, since as the DLL sweep (see below) is performed the first three and last two samples are not guaranteed to be written correctly in the DRAM. The evaluation is described in more detail in FIGS. 6A-6G. On subsequent iterations of step 116, the current 3-bit sample is transferred to a "previous sample" register whilst the newly sampled data provides the content of a "current sample" register, the content of the two being compared in subsequent steps as described in more detail below.

In a subsequent sequence of steps, when the DQ training is performed, the steps shown in FIG. 5B are carried out. Firstly (at step 120) all de-skew DLL logic 34 and 35 are reset. For example, these can be set to a minimum possible value (setting the DQ bit/DM timing in advance by 90 degrees of their default central position) with respect to the overall offset provided by the write centering DLL 37. At step 122 the write centering DLL 37 in each bytelane is also set to an initiation value of zero. At step 124 the various DQ registers used during the following calibration procedure are all set to 0 (bad2good, good_count, iteration, sum_bad2good and sum_good_count).

The iterative steps of the process are then started at step 126 where all sampling flops 40, 42, 44, 46 are reset, the rising edge flops being reset to 1 and the falling edge flops being reset to 0. Then at step 128, the memory controller 12 (via each bytelane 18) instructs the DRAM modules 16 to perform a write operation in BL8 mode in which the predetermined sequence of data values 11010100 is written over 8 beats on each DQ bit (this is indicated in short-hand in the figure as FF FF 00 FF 00 FF 00 00). DM is held at 0, indicating that the DQ signal is valid throughout. After this first write operation, at step 130, the memory controller 12 (via each bytelane 18) instructs the DRAM modules 16 to perform a read operation in BL8 mode on each DQ bit. Hence, if the relative timing of DQ, DM and DQS is correct at this iteration of the process, the sequence 11010100 should be received on each DQ bit. At step 132 each bytelane waits for the read data to return. When the read data has been captured by the respective bytelane, for the purposes of the DQ training procedure at step 134 the $3^{rd}$, $4^{th}$, $5^{th}$ and $6^{th}$ samples for each DQ bit (i.e. numbered 3, 4, 5, 6) are loaded into a respective register for evaluation and that evaluation begins at step 136. Note that these particular samples (the middle four samples) are examined, since they have a two bit "padding" to allow for the DQ high impedance state before/after write during the DLL sweep (see below) and hence these samples are more reliably written/read in the DRAM. The particular predetermined sequence of data values 11010100 and the selected subset of the $3^{rd}$-$6^{th}$ bits within this sequence are chosen, because the subset "0101" is unique within the sequence, facilitating the identification of the correct subset within the sequence. The evaluation is described in more detail in FIGS. 6A-6G. On subsequent iterations of step 136, the current 4-bit sample is transferred to a "previous sample" register whilst the newly sampled data provides the content of a "current sample" register, the content of the two being compared in subsequent steps as described in more detail below.

The detailed steps of the evaluation process (beginning at step 140) which are taken in one embodiment when carrying out the write data eye training procedure are shown in FIGS. 6A-6G. Note that the steps shown in FIGS. 6A-6E are carried out (iteratively) firstly when evaluating for the DM training phase and secondly (iteratively) when evaluating for the DQ training phase.

For the DM training evaluation process the comparison pattern looked for is 101, since these are bits 4, 5 and 6 of the correct sequence 11110111 in the DM training stage. For the DQ training evaluation process the comparison pattern looked for is 0101, since these are bits 3, 4, 5 and 6 of the correct sequence 11010100 in the DQ training stage. Note that for the DM training, the setting of only a single DLL timing is being determined and the eight DQ bits (DQ[7:0]) are treated as a bus (not as individual bits) and the matching of the required pattern is decided based on the bus matching the desired pattern, i.e. for a match to be found the required sequence 101 must be found on all 8 DQ bits. By contrast, for the DQ training 8 individual DLL timings (one for each DQ bit) are being determined and the matching of the required pattern is determined for each DQ bit individually.

At step 142 it is determined if the respective current DQ sample(s) match the required pattern (i.e. 101 (DM) or 0101 (DQ)) and the last sample(s) did not match. Note that since the DM training requires all 8 DQ bits simultaneously to match the pattern, for the timing calibration of the one DM bit, in the DM training there is only one determination to be made at step 142. By contrast in the DQ training the determination at step 142 is made individually for each DQ bit. In other words, this determines the point at which, when sweeping through in DLL (by means of the write DQ centering DLL 37), the first match of the pattern is found, where previously a match was not found. When this is the case, the flow proceeds to step 144 where the current DLL step is saved into the respective bad2good register entry corresponding to this DM or DQ bit. Then at step 146 the good_count entry for the respective DM or DQ bit is incremented by 1. At step 148 it is determined if the DLL step is at its maximum. The DLL sweep is performed by incrementing the write DQ centering DLL 37 through its full range of 0 to 255 and if it is determined that this has already reached 255 then (step 152 and 154) the system has an unexpected error and the calibration process has failed. If however further iterations of DLL steps are possible, then at step 150 the DLL is incremented (in this example embodiment in steps of 1/256 of a clock cycle) and the flow returns to step 106 (see FIG. 5A) or step 126 (see FIG. 5B) depending on whether DM or DQ training is currently being carried out. When, at step 142, it is determined that (either for a given DQ bit in the DQ training or for the DQ bus as a whole for the DM training) the "current samples match, previous samples did not match" condition is not satisfied, then the flow proceeds to step 156 (see FIG. 6B).

At step 156 it is determined, for the DQ bus in the DM training, and for each DQ bit for the DQ training, if the respective current DQ sample(s) match and the previous sample(s) also matched. In other words, it is tested if, for this DQ bit (DQ training) or for the DQ bus as a whole (DM training), the current DLL offset provides a timing offset part-way through a valid range of offsets. Whilst this is the case the flow proceeds to step 158 where the good_count value for the corresponding DQ/DM bit is incremented by one. Following this, at step 160 it is determined if the DLL step has already reached its maximum and this being the case then (step 164 and 166) the system has unexpectedly failed (by reaching the end of the possible DLL offset without identifying the end of the predetermined data pattern) and the process exits. If however further DLL steps are possible then the flow proceeds via step 162 where the DLL step is incremented and the flow returns to step 106 (see FIG. 5A) or step 126 (see FIG. 5B) depending on whether DM or DQ training is currently being carried out. Alternatively, if at step 156 it is determined that the "both current and previous samples match" condition is not met then the flow proceeds to step 168 (see FIG. 6C).

At step 168 it is determined, for the DQ bus in the DM training, and for each DQ bit for the DQ training, if the respective current DQ sample(s) do not match the pattern and the last sample(s) did match the pattern. In other words, it is tested, for each DQ bit (DQ training) or for the DQ bus as a whole (DM training), if the end of the range of valid DLL offsets which result in a match has been reached. When this point is found, the flow proceeds to step 170 where it is verified if, for the good_count value corresponding to this DQ/DM bit, the respective good_count value is at least the minimum good_count value set by the user, i.e. if a sufficiently long range of valid timing offsets has been identified for this DQ/DM bit. The minimum good_count is user programmable according to the particular system requirements, but this may for example be set at 50% of the ideal eye.

Figure 6A:
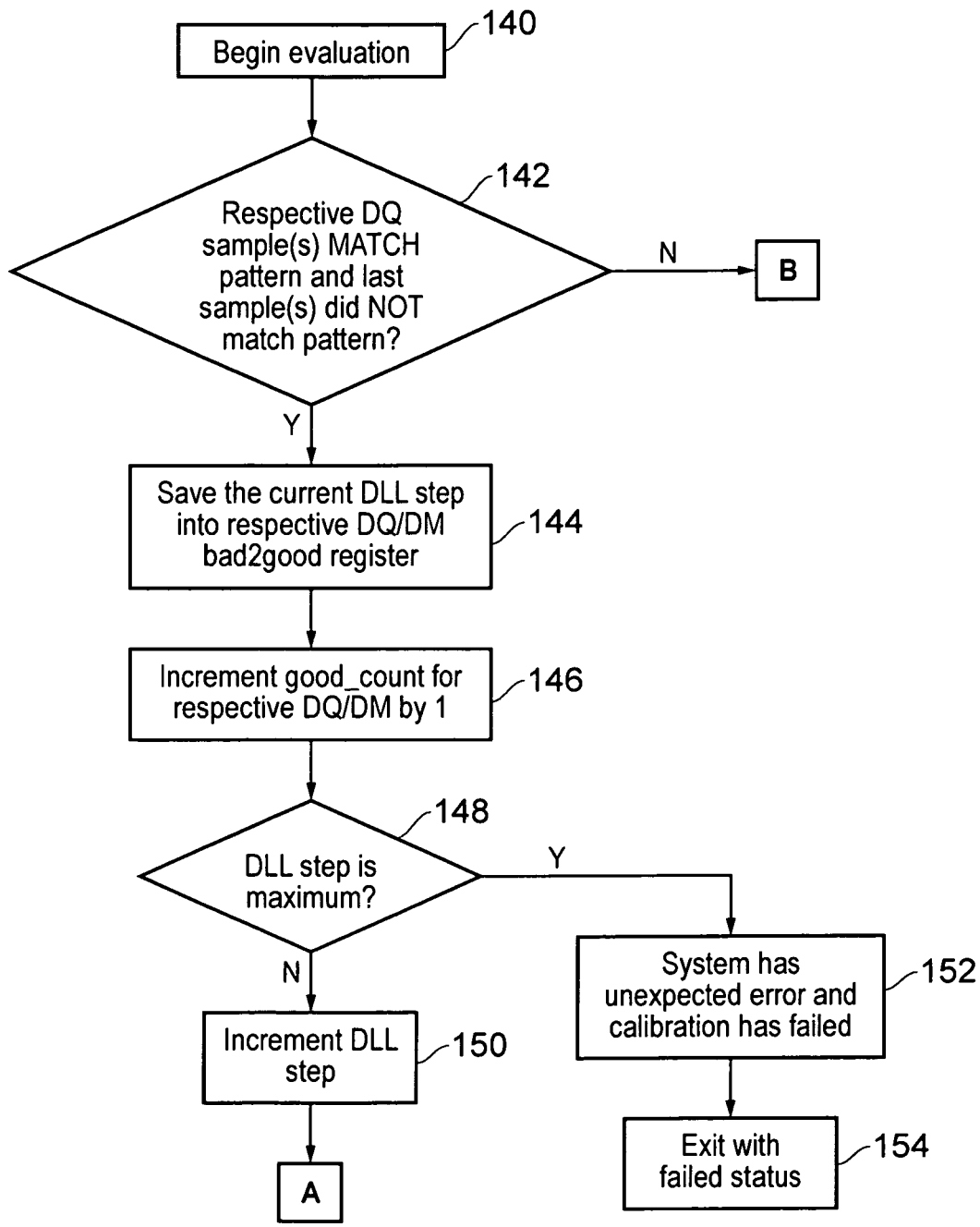
FIGS. 6A-G schematically illustrates a series of steps taken in one embodiment in which calibration of a memory controller is carried out.
Figure 6B:
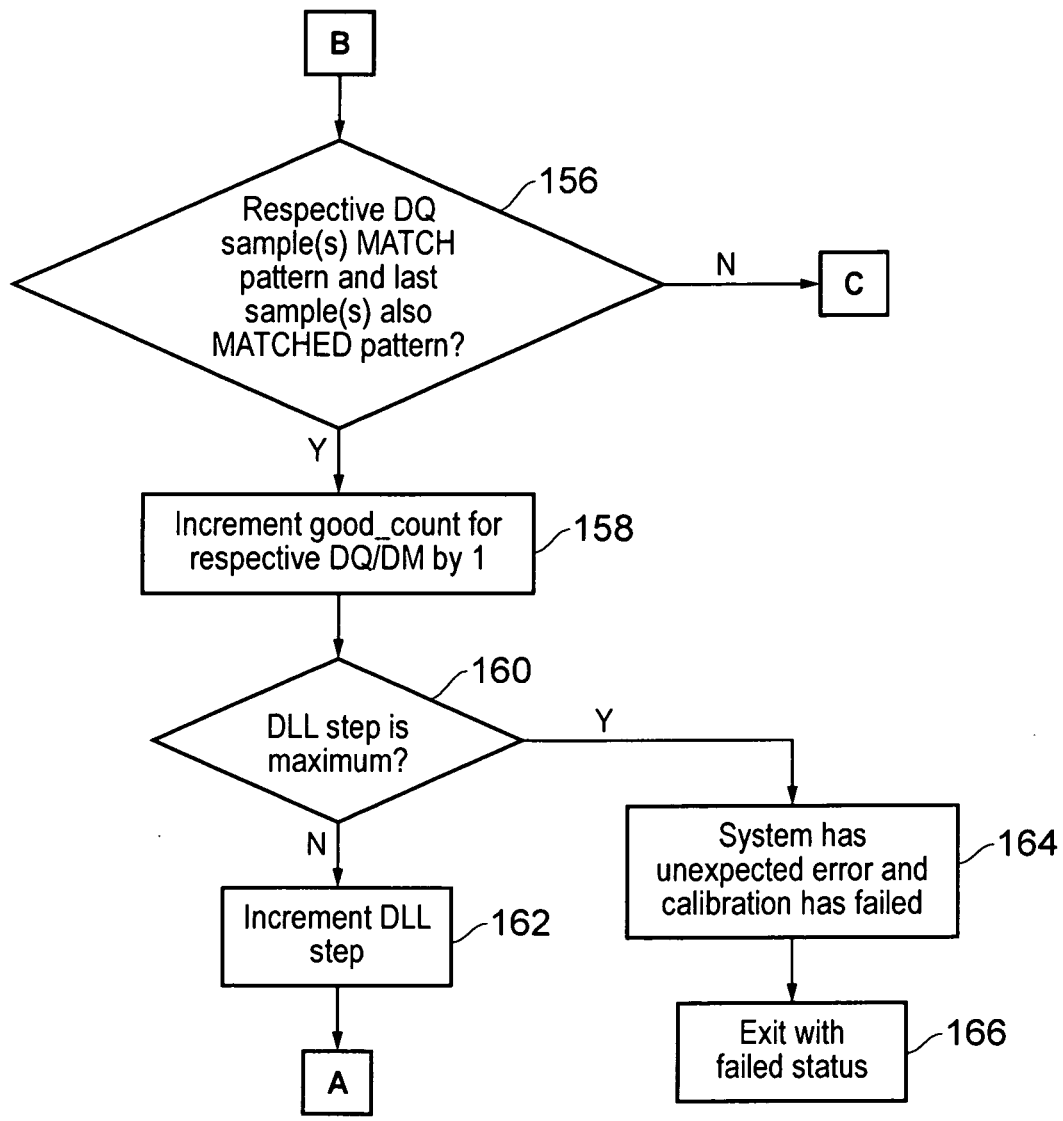
Figure 6C:
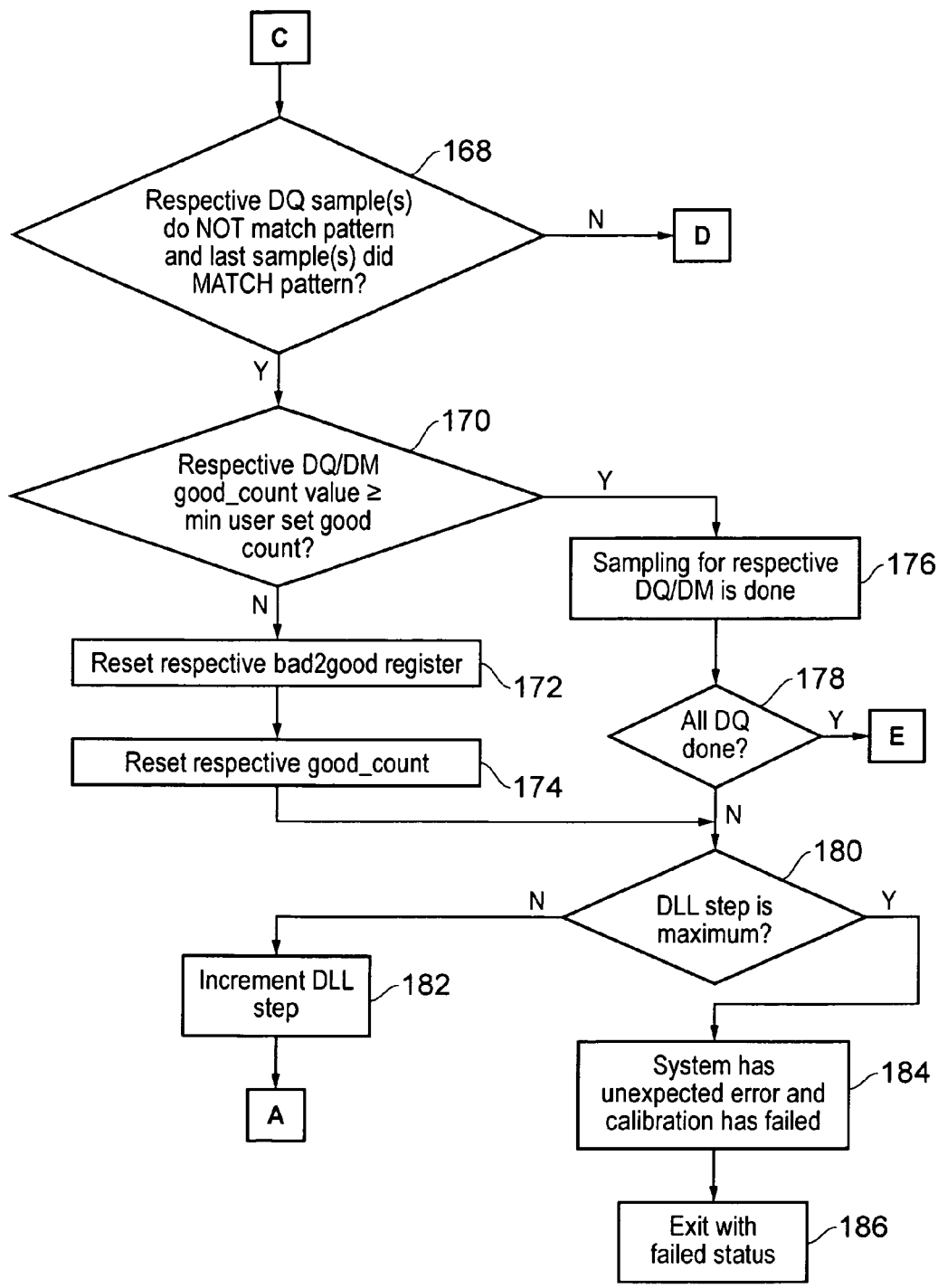
Figure 6D:
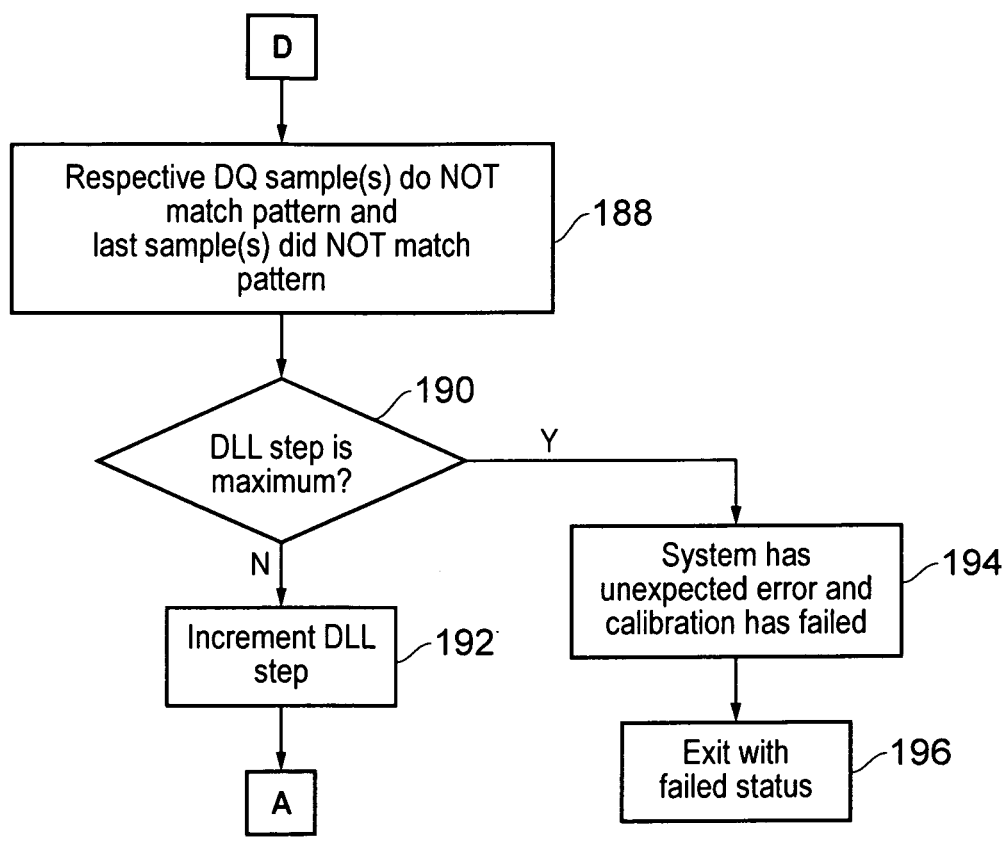
Figure 6E:
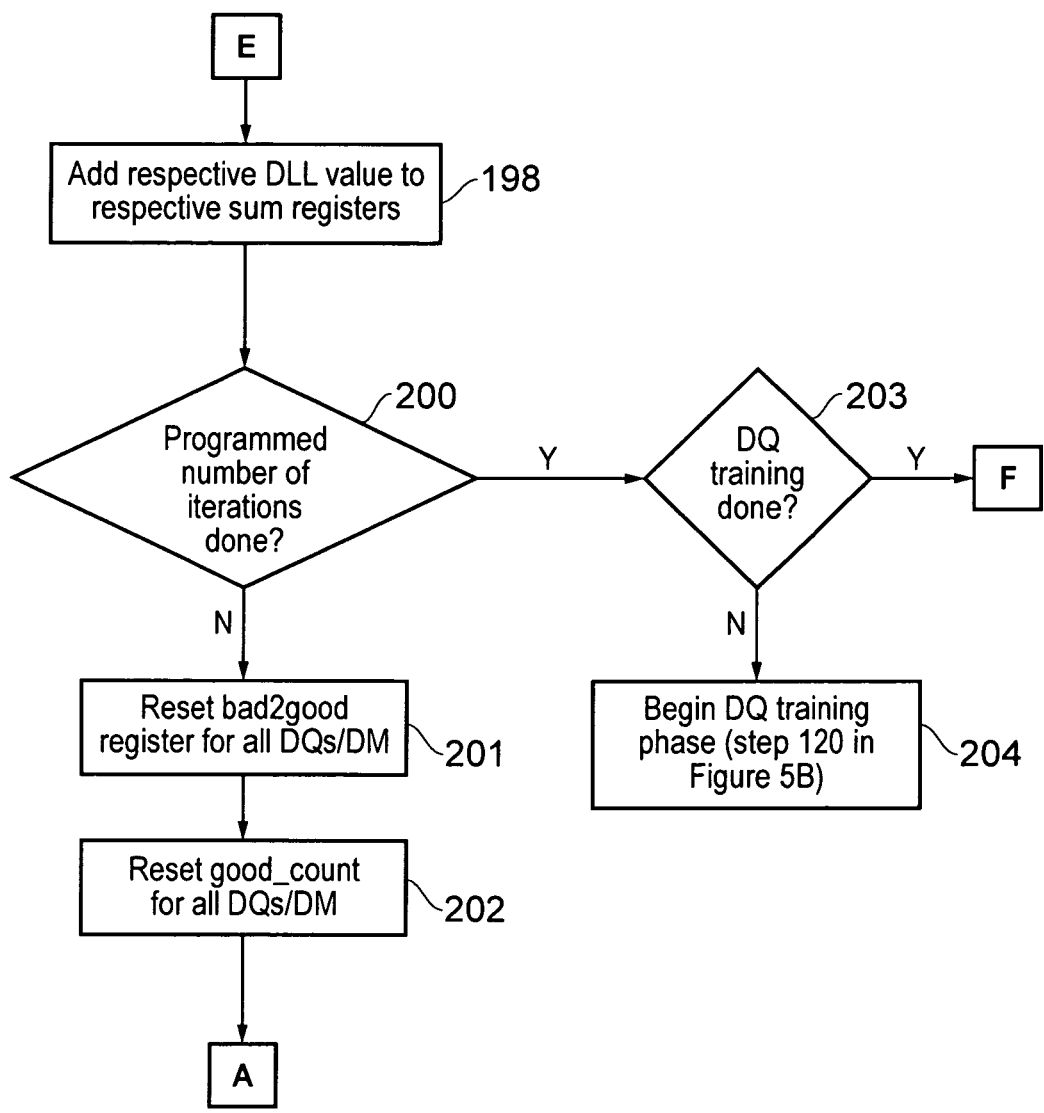

If this condition is satisfied then (step 176) the sampling for this DQ/DM bit is completed and at step 178 if the sampling for all DQ bits is completed (note that in the DM training, where is the set of 8 DQ bits is considered together, this condition is always met) then the flow proceeds to step 198 (see FIG. 6E). If however (in the DQ training) other DQ bits still have further sampling to be performed then (if further DLL steps are available (step 180)), the DLL step is incremented at step 182 and the flow returns to step 106/step 126 (see FIG. 5A/B). If it is determined at step 180 that the DLL step is at its maximum then the flow proceeds to steps 184 and 186 since the system has an unexpected error (in that the DLL has reached its maximum before the end point for all DQ bits have been found) and the calibration process has failed.

At step 170 if, on the other hand, the minimum user set good_count has not been achieved then the flow proceeds to step 172 where the respective bad2good register entry is reset and step 174 where the respective good_count value is reset, indicating that the previously identified sample(s) which matched did not fulfil the minimum timing window requirement and further matching samples are searched for on this DQ/DM bit, the flow proceeding to step 180.

If at step 168 the "current sample(s) do not match, last sample(s) did match" condition is not met then (by process of elimination) neither the current sample(s) nor the previous sample(s) matched (step 188, FIG. 6D). In this situation as long as the DLL step has not reached its maximum (step 190) then at step 192 the DLL is incremented and the flow returns to step 106/step 126 (see FIG. 5A/B). If at step 190 the DLL has reached its maximum then the system has an unexpected error and the calibration has failed, exiting with a failed status (steps 194 and 196).

Figure 6F:
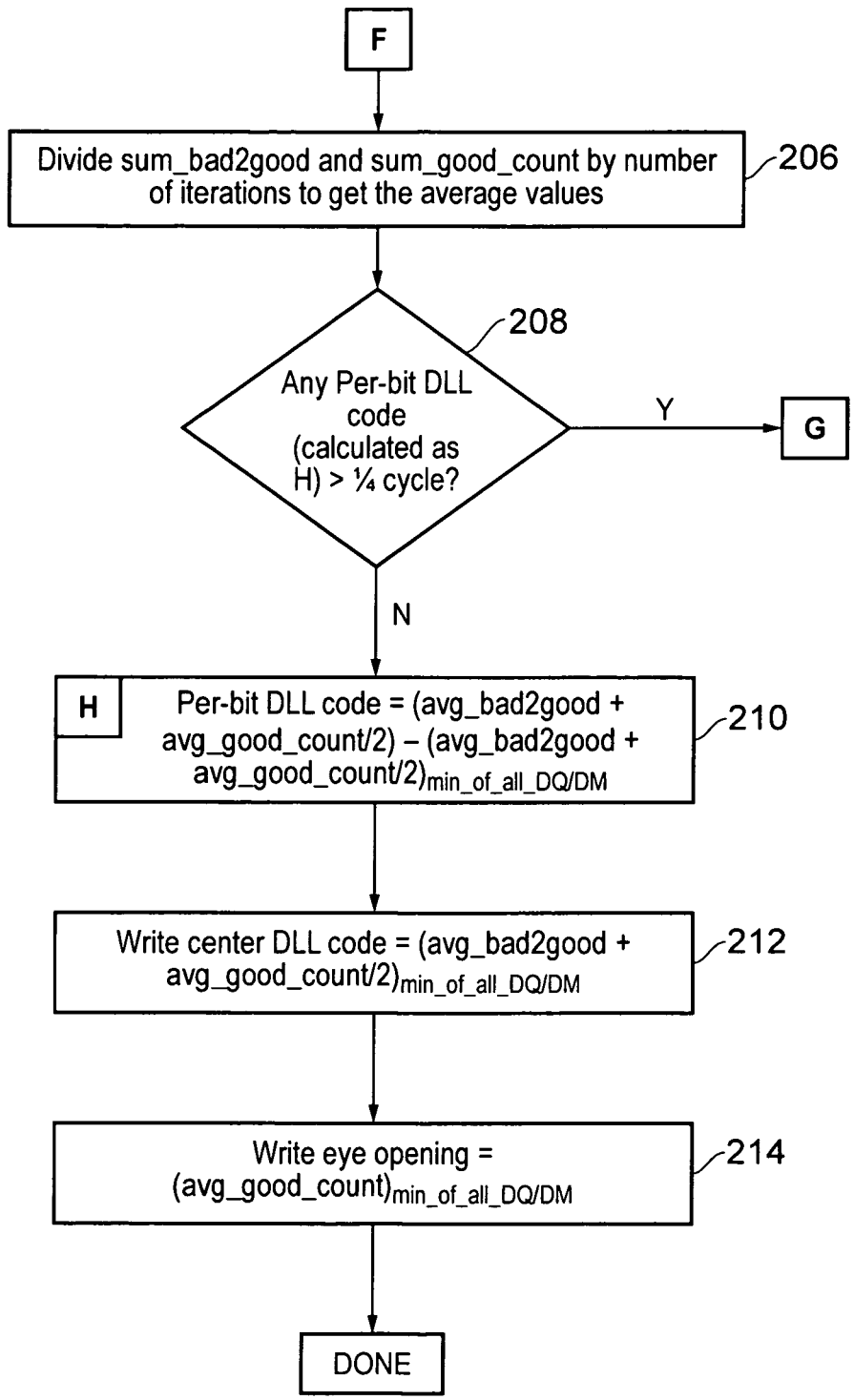
Figure 6G:
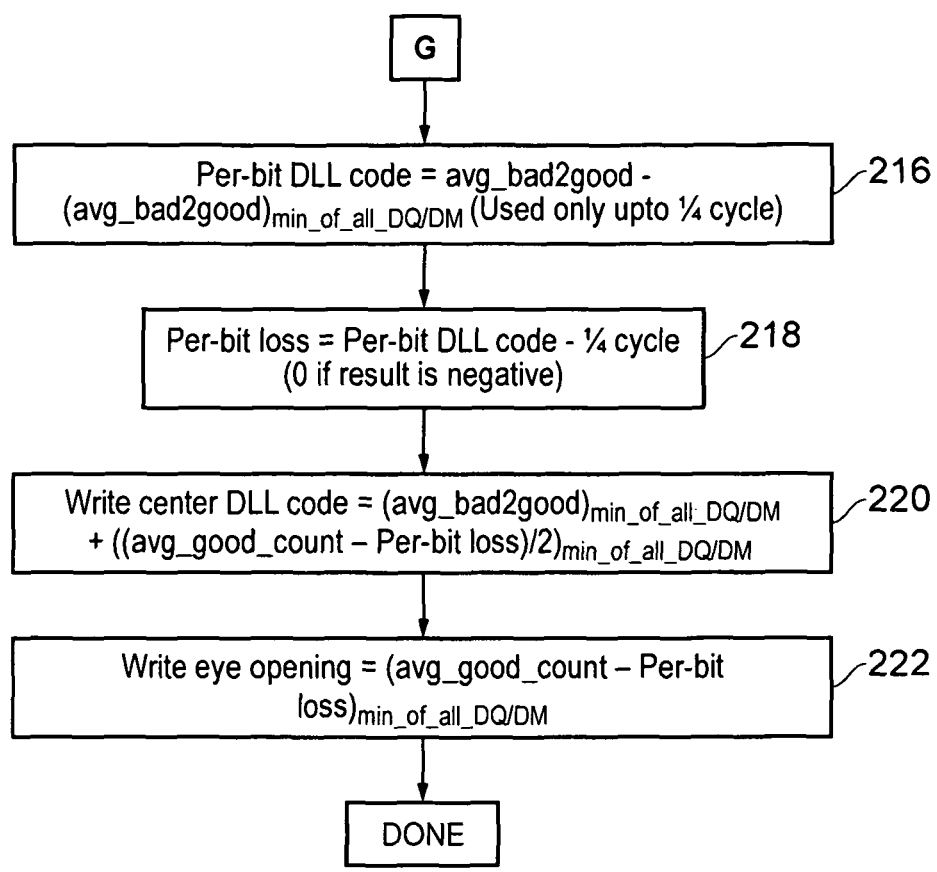

Turning to FIG. 6E, step 198 is reached if it is determined at step 178 (see FIG. 6C) that the sampling for all DQ bits in the DQ training or for the DQ bus in the DM training has been successfully completed on this sweep of the DLL. At step 198 the respective DLL value is added, for the DM bit or for each DQ bit, to the respective sum registers (i.e. sum_bad2good and sum_good_count). Then at step 200 it is determined if the program number of iterations over which the averaging process is to be carried out have been completed. If they have not then at step 201 the bad2good register for all DQ bits/the DM bit is reset and at step 202 the good_count register for all DQ bits/the DM bit is also reset. The flow then returns to step 106/step 126 (see FIG. 5A/B) for these further iterations to be done. If however at step 200 it is determined that the programmed number iterations have completed, then the flow proceeds to step 203, where it is determined if the DQ training has completed, in other words if both the DM training phase and the DQ training phase have been carried out, since the DM training phase is performed before the DQ training phase. If the DQ training phase has not yet been performed, then via step 204 the flow returns to step 120 (see FIG. 5B) for the DQ training to begin. If the DQ training phase has also been completed, then the flow proceeds to step 206 (FIG. 6F).

At step 206 the sum_bad2good and sum_good_count values (for each DQ bit and for the DM bit) are divided by the number of iterations carried out to get their average values. Then, a per-bit DLL code (i.e. a calculated setting required for each of the nine (8 DQ and 1 DM) de-skew DLL 34, 35) is determined as:

$$\text{Per-bit DLL code} = (\text{avg\_bad2good} + \text{avg\_good\_count}/2) - (\text{avg\_bad2good} + \text{avg\_good\_count}/2)_{min\_of\_all\_DQ/DM}$$

At step 208 it is determined if any per-bit DLL code has been evaluated as greater than a quarter clock cycle. If it is then, in this embodiment, the de-skew offset required for the respective DQ/DM bit cannot be provided and the flow proceeds to step 216 (see FIG. 6G). If however all per-bit DLL codes are within this quarter cycle limit then the flow proceeds to step 210, where this definition of the per-bit DLL codes is accepted and the de-skew DLL 34, 35 are configured accordingly. Next at step 212, the calibration for the write DQ centering DLL 37 ("write center DLL code") is determined as:

$$\text{Write center DLL code} = (\text{avg\_bad2good} + \text{avg\_good\_count}/2)_{min\_of\_all\_DQ/DM}$$

Finally, at step 214 the write eye opening is determined as the minimum (across the DQ bits and DM bit) of the averaged good_count values. The write eye training has then successfully completed. The training can be performed for each chip-select present in the system based on requirement.

In the event that the at least one per-bit DLL code exceeds a quarter cycle (see step 208) then the flow proceeds to step 216. Here, a replacement per-bit DLL code is determined as:

Per-bit DLL code=avg_bad2good−(avg_bad2good)$_{min\_of\_all\_DQ/DM}$

Then at step 218 a per-bit loss value is determined as the per-bit DLL code thus determined less a quarter cycle. In other words if the per-bit DLL code (as determined at step 210) is less than a quarter cycle then there is no per-bit loss, otherwise the per-bit loss quantifies the "excess" over a quarter cycle which could not be adjusted for. The value is set to zero if the result is negative. This per-bit DLL code is reported to the system operator and used for system debugging. At step 220 the write center DLL code is determined as:

Write center DLL code=(avg_bad2good)$_{min\_of\_all\_DQ/DM}$+((avg_good_count−Per-bit loss)/2)$_{min\_of\_all\_DQ/DM}$ Finally, at step 222 the overall write eye opening may be determined as the minimum across all DQ/DM bits of the average good_count minus the per-bit loss. The write eye training has been successfully completed (albeit with some per-bit loss).

Figure 7A:
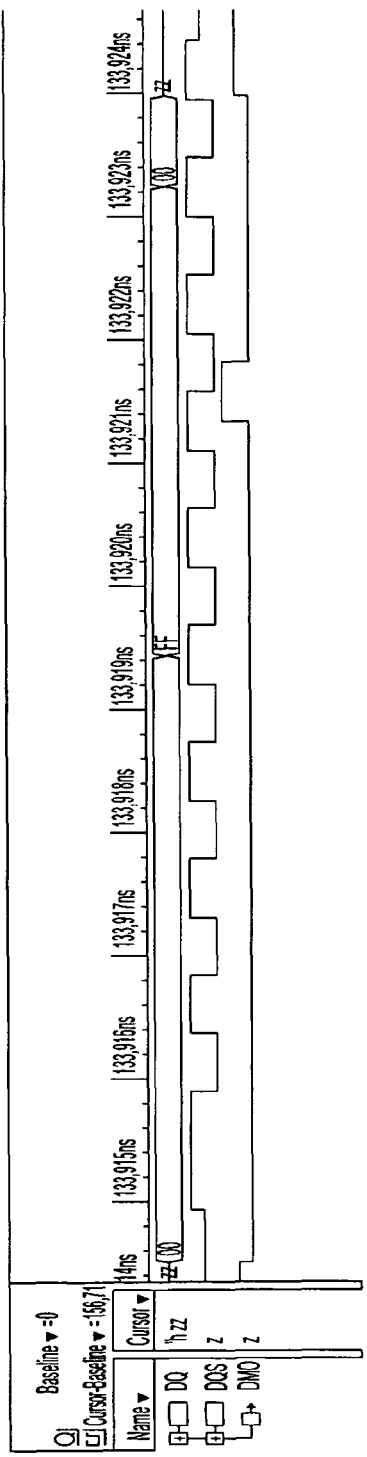
FIG. 7A shows a simulation of a write data pattern, a data strobe signal and a data mask signal in a mask signal training procedure of one embodiment.
Figure 7B:
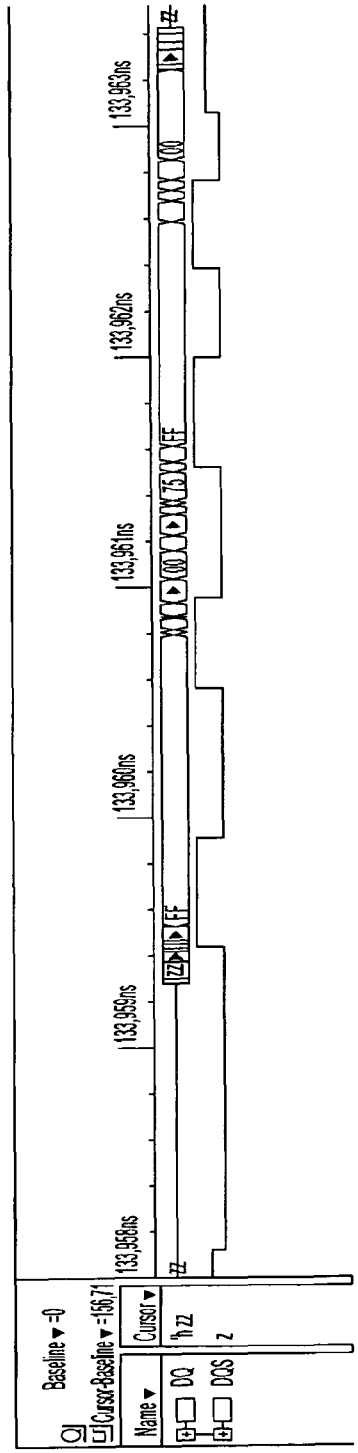
FIG. 7B shows a simulation of the read data pattern and data strobe signal returned in the same mask signal training procedure as FIG. 7A.
Figure 8A:
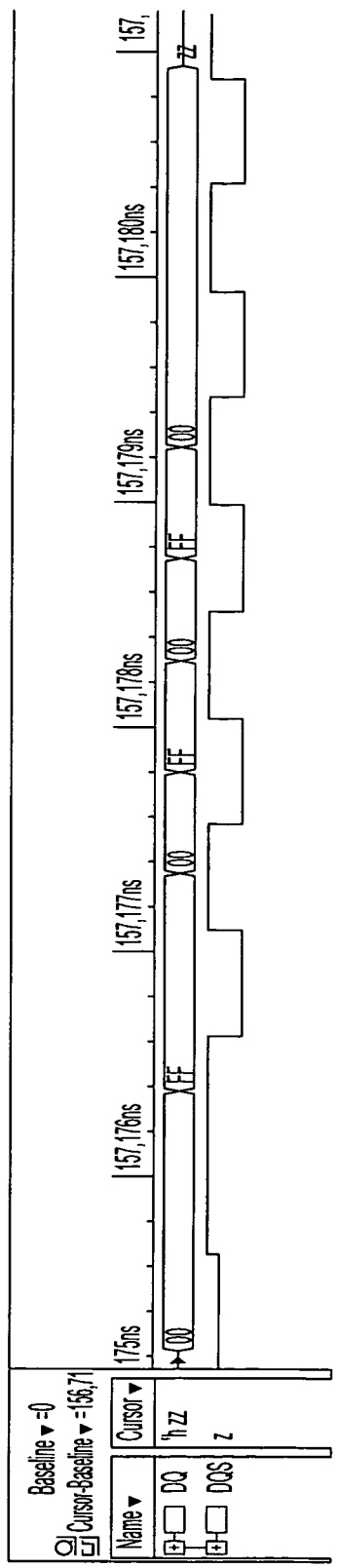
FIGS. 8A and 8B show a simulation of the write data pattern and read data returned for a data signal training procedure in one embodiment.
Figure 8B:
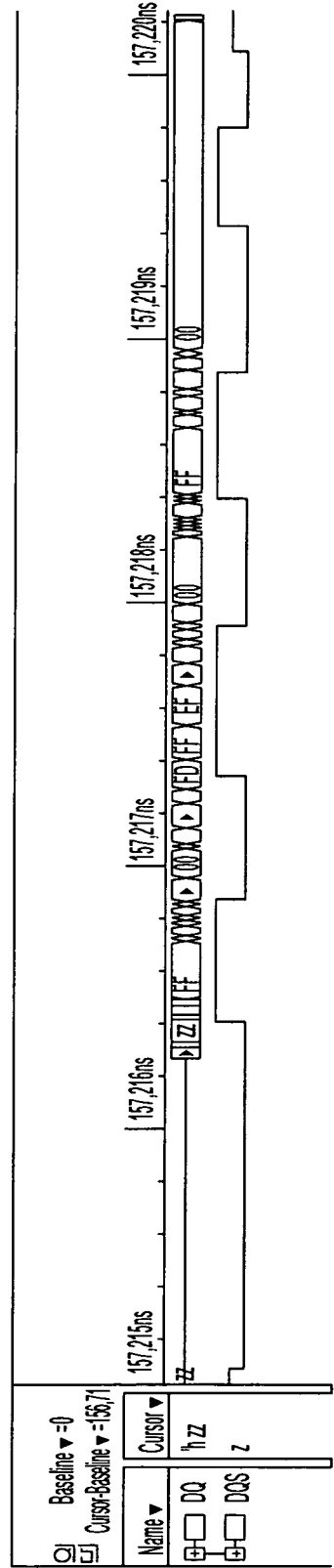

FIGS. 7A, 7B, 8A, 8B, 9A and 9B show some simulation results. FIG. 7A shows the write data patterns in the DM training phase (i.e. a continuous sequence of 0's followed by a continuous sequence of 1s) together with the accompanying DQS signal and the data mask signal DM (valid for all beats but the $5^{th}$ beat of the second sequence) and FIG. 7B shows the DRAM read data returned in the DM training phase. FIG. 8A shows the write data pattern in the DQ training phase (i.e. 11010100 on each DQ bit) and FIG. 8B shows the DRAM read data returned in the DQ training phase. FIG. 9A shows the relationship between DQ, DM and DQS before the per-bit (for DQ and DM) write calibration described above. The valid data pattern is 0xAA55. In this configuration the DRAM cannot reliably capture the data as the data valid window (the write eye) does not allow DQS to be reliably centred in the data burst). FIG. 9B shows the same simulated situation after the per-bit write calibration (for DQ and DM) described above has been carried out. The valid data pattern is again 0xAA55. The write eye opening is now increased at the capture flops and DQS is now placed in the centre of the write eye. The DRAM can now more reliably capture the data burst. These simulations include system jitter and DRAM timing uncertainty.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of calibrating a memory controller, said memory controller configured to transmit a data signal, a data strobe signal and a mask signal to a memory, wherein each transition of said data strobe signal indicates a sample point for said data signal and said mask signal indicates a validity of said data signal, the method comprising performing a mask signal training procedure comprising the steps of:
   a) writing a first value to said memory for a predetermined plurality of transitions of said data strobe signal with said mask signal set to indicate that said data signal is valid;
   b) writing a second data value to said memory for said predetermined plurality of transitions of said data strobe signal with said mask signal set to indicate that said data signal is valid except for a selected transition of said predetermined plurality of transitions for which said mask signal is set to indicate that said data signal is invalid, wherein said second value is an inverse of said first value;
   c) reading from said memory for said predetermined plurality of transitions of said data strobe signal and determining if a value read at said selected transition matches said first value; and
   d) determining a timing offset for said mask signal for which said value read at said selected transition matches said first value.

2. The method of claim 1, wherein said selected transition is preceded and followed by at least one transition in said predetermined plurality of transitions.

3. The method of claim 2, wherein determining if said value read at said selected transition matches said first value further comprises determining if a value read at a transition preceding said selected transition and a value read at a transition following said selected transition each match said second value.

4. The method of claim 1, wherein performing said mask signal training procedure further comprises repeating said steps of a) writing said first value to said memory, b) writing said second data value to said memory and c) reading from said memory iteratively to determine a valid range of said timing offset for said mask signal.

5. The method of claim 4, wherein a calibrated mask signal timing offset is selected from said valid range of said timing offset for said mask signal such that said data strobe signal is aligned centrally with respect to said valid range of said timing offset for said mask signal.

6. The method of claim 1, wherein said mask signal training procedure is repeated to determine an averaged timing offset for said mask signal.

7. The method of claim 1, further comprising performing a data signal training procedure, said data signal training procedure comprising the steps of:
   a) writing a predetermined sequence of data values to said memory over a second predetermined plurality of transitions of said data strobe signal;
   b) reading data values from said memory over said second predetermined plurality of transitions of said data strobe signal and determining if a selected subset of said data values read from said memory matches a corresponding subset of said predetermined sequence of data values written to said memory; and
   c) determining a timing offset for said data signal for which said selected subset of said data values read from said memory matches said corresponding subset of said predetermined sequence of data values written to said memory.

8. The method of claim 7, wherein performing said data signal training procedure further comprises repeating said steps of a) writing a predetermined sequence of data values to said memory and b) reading said data values from said memory iteratively to determine a valid range of said timing offset for said data signal.

9. The method of claim 8, wherein a calibrated data signal timing offset is selected from said valid range of said timing offset for said data signal such that said data strobe signal is aligned centrally with respect to said valid range of said timing offset for said data signal.

10. The method of claim 8, wherein said timing offset for said data signal is determined for each bit of a multi-bit data signal, and wherein a calibrated data signal timing offset for each bit of said multi-bit data signal is determined such that a midpoint of said valid range of said timing offset for each bit of said data signal are aligned with one another.

11. The method of claim 10, wherein, if said calibrated data signal timing offset for any bit of said multi-bit data signal is determined to exceed a predetermined limit, said method further comprises generating information indicative of an extent to which said predetermined limit has been exceeded.

12. The method of claim 7, wherein said corresponding subset of said predetermined sequence of data values represents a unique pattern in said predetermined sequence of data values.

13. The method of claim 7, wherein said selected subset of data values is preceded and followed by at least one data value in said predetermined sequence of data values.

14. The method of claim 7, wherein said data signal training procedure is repeated to determine an averaged timing offset for said data signal.

15. The method of claim 7, wherein said data signal is a multi-bit data signal.

16. The method of claim 15, wherein said timing offset for said data signal is determined for each bit of said multi-bit data signal.

17. A memory controller, said memory controller configured to transmit a data signal, a data strobe signal and a mask signal to a memory, wherein each transition of said data strobe signal indicates a sample point for said data signal and said mask signal indicates a validity of said data signal, the memory controller comprising:
a) write circuitry configured to write a first value to said memory for a predetermined plurality of transitions of said data strobe signal with said mask signal set to indicate that said data signal is valid;
b) said write circuitry configured to write a second data value to said memory for said predetermined plurality of transitions of said data strobe signal with said mask signal set to indicate that said data signal is valid except for a selected transition of said predetermined plurality of transitions for which said mask signal is set to indicate that said data signal is invalid, wherein said second value is an inverse of said first value; and
c) read circuitry configured to read from said memory for said predetermined plurality of transitions of said data strobe signal and determining if a value read at said selected transition matches said first value, wherein said memory controller is configured to determine a timing offset for said mask signal for which said value read at said selected transition matches said first value.

18. The memory controller of claim 17, wherein said memory controller comprises a delay unit configured to apply a transmission timing offset for said data signal when said data signal is transmitted to said memory, and wherein said memory controller is configured to use said delay unit to apply a reception timing offset for a received data signal when said received data signal is received from said memory.

19. A memory controller, said memory controller configured to transmit a data signal, a data strobe signal and a mask signal to a memory, wherein each transition of said data strobe signal indicates a sample point for said data signal and said mask signal indicates a validity of said data signal, the memory controller comprising:
a) means for writing a first value to said memory for a predetermined plurality of transitions of said data strobe signal with said mask signal set to indicate that said data signal is valid;
b) means for writing a second data value to said memory for said predetermined plurality of transitions of said data strobe signal with said mask signal set to indicate that said data signal is valid except for a selected transition of said predetermined plurality of transitions for which said mask signal is set to indicate that said data signal is invalid, wherein said second value is an inverse of said first value;
c) means for reading from said memory for said predetermined plurality of transitions of said data strobe signal and determining if a value read at said selected transition matches said first value; and
d) means for determining a timing offset for said mask signal for which said value read at said selected transition matches said first value.

* * * * *